United States Patent [19]

Hendrickson et al.

[11] 4,454,186

[45] Jun. 12, 1984

[54] PRIMED SURFACE AND CHARGE TRANSFER MEDIA

[75] Inventors: William A. Hendrickson, St. Paul; Dudley M. Sherman; Hsin-hsin Chou, both of Woodbury; Vasant V. Kolpe, St. Paul, all of Minn.

[73] Assignee: Minnesota Mining and Manufacturing Company, St. Paul, Minn.

[21] Appl. No.: 345,403

[22] Filed: Feb. 3, 1982

[51] Int. Cl.³ ............................ B32B 3/14; B32B 3/16; G03G 5/14
[52] U.S. Cl. .................................... 428/148; 428/925; 428/938; 430/66; 430/530; 430/524; 427/75; 427/124
[58] Field of Search ................. 430/66, 524, 527, 530, 430/62; 428/201, 458, 148, 925, 938; 427/71, 75, 91, 124

[56] References Cited

U.S. PATENT DOCUMENTS

| | | | |
|---|---|---|---|
| 3,234,017 | 2/1966 | Heyl et al. | 430/110 X |
| 4,295,714 | 10/1981 | Payne | 354/3 |
| 4,318,978 | 3/1982 | Borrelli et al. | 430/346 |

OTHER PUBLICATIONS

Electron Microscopy Society of America, 33rd Annual Meeting Published Proceedings 1975 "Formation Mechanism for Multiply Twinned Particles During Nucleation in the Au/MICA System" Eal H. Lee and Helmut Poppa.

*Primary Examiner*—John D. Welsh
*Attorney, Agent, or Firm*—D. M. Sell; J. A. Smith; M. A. Litman

[57] ABSTRACT

An article having a primed surface or improved electric charge transfer properties is disclosed. The surface has discrete sites of inorganic materials thereon.

20 Claims, No Drawings

PRIMED SURFACE AND CHARGE TRANSFER MEDIA

TECHNICAL FIELD

The present invention relates to a novel method for forming novel primed polymer surfaces, novel composite articles having such surfaces, and particularly electrostatic charge transfer surfaces. Plasma treatment (either R.F., A.C. or D.C. generated) with an inorganic material present in the plasma causes a catalytic oxidation of the polymer surface to produce an oxygen enriched primed polymer surface. On a photoconductive insulator surface and a dielectric polymer surface, this produces conductivity sites which enhance the transfer of electrostatic charge from one such surface to another.

Over the past several decades, organic polymers have been extensively utilized to produce articles such as films, sheets, coatings, tapes or cloths, and are particularly desirable because of their superior physical and chemical properties in such areas as electrical characteristics, thermal characteristics, chemical resistance, flexibility and shatter resistance. However, since their surface is inert and insulative, they suffer from the shortcoming of low adhesion when it is desired to form composites with other materials such as toners, adhesives, paints, inks, etc., and electrostatic charge transfer to such a surface is inefficient.

To improve the adhesion of such polymer surfaces for toners, adhesives, paints, inks, etc., prior art techniques have employed primer layers, chemical etching of the surface, physical roughening of the surface or glow discharge. The latter of these techniques has more recently received greater utilization as improved glow discharge equipment, such as R.F. and magnetron sputtering, has been developed. The R.F. and magnetron sputtering techniques are particularly useful to microroughen and, hence, improve adhesion of low melting point dielectric materials such as polymers. Such techniques to improve adhesion of polymer surfaces are well known in the prior art.

It has been desirable to find a method of treating polymer surfaces to still further enhance their adhesion and, thus, extend their utility in forming composites with other materials. The present invention discloses a method for oxidizing amorphous and crystalline polymeric material so that the adhesion of the surface is significantly improved.

The transfer of latent electrostatic images from one surface to another, as for example, from an electrophotographic plate to a dielectric surface, provides a method of electrostatic printing or copying free from the steps of plate and drum cleaning, thereby eliminating the need for cleaning devices, and consequently improving the life of plates and drums and reducing the maintenance requirements. Processes known in the prior art for the transfer of electrostatic images (an art at times referred to by the acronym, TESI) have found practical application in commercial electrophotographic or electrostatic printing only for low resolution images.

In electrophotography or electrostatic printing, the prior art techniques for accomplishing charge transfer from one surface to another involves either: (1) conduction of electric charges across an air gap, or (2) direct charge transfer if the air gap is eliminated. While the air breakdown charge transfer technique is simple, it does not provide high resolution (less than 80 line pairs per millimeter (lp/mm) can be achieved) or continuous tone gray scale reproduction. Finally, this method also requires the donor surface to sustain high surface potentials to insure air breakdown. The presently known techniques for direct charge transfer require very smooth surface, a transfer liquid interfacing the donor and receptor films, or very high pressures to eliminate the air gap. Even though high resolution of up to 150 lp/mm charge transfer has been claimed, these techniques are impractical and the charge transfer efficiency is generally low. Accordingly, there remains a need for a simple means of making high resolution charge transfer images with gray scale fidelity and high transfer efficiency.

One aspect of the invention is to provide an efficient charge donating photoconductive-insulative surface.

Another aspect of the invention is to efficiently transfer a high resolution latent electrostatic charge image from the charge donating photoconductive-insulative surface to the charge receptor medium while these surfaces are in virtual contact.

One aspect of the present invention is to provide a process for improving the adhesion of polymer surfaces.

A further aspect of the present invention is to provide a method for oxidizing polymer surfaces using a metal catalyst and an oxygen-containing plasma.

A further aspect of the present invention is to provide an improved primed polymer surface, particularly for pressure sensitive acrylics and for hot melt copolyester adhesives.

A further aspect of the present invention is to provide a method of priming polymer surfaces which is both efficient and pollution-free.

BACKGROUND ART

It is conventional practice in many different areas of technology to improve the bonding capability of surfaces by treating them in one fashion or another. This treatment, in all of its various forms, is generally called priming. The most common methods of priming surfaces include the application of an intermediate layer, physically roughening the substrate, chemically modifying the substrate (e.g., oxidation), and combinations of these methods. With advances in related technologies, each of these methods may be formed by more efficient procedures, but generally accomplish similar effects. That is, for example, in a physical roughening process, the use of such different procedures such as dry abrasive grit, rotary brushes, abrasive grain slurries, and other similar techniques produce similar effects with their own slight variations in properties.

U.S Pat. Nos. 4,064,030 and 4,155,826 show that radio frequency (R.F.) sputter-etching of fluorinated olefin polymer surfaces provide improved adhesion for other coating materials without the discoloration attendant alkali etching. The sputter-etching is also stated to be more effective than physical roughening or glow discharge to effect priming.

U.S. Pat. No. 3,018,189 shows the use of electrical discharges to modify the surface of a polymer to improve the adhesion of other materials to it.

The deposition of metal oxide coatings onto polymer surfaces to improve adhesion by a cathodic deposition from a solution of isopropanol and a nitrate salt is shown in U.S. Pat. No. 4,094,750.

U.S. Pat. No. 3,852,151 discloses the use of a discontinuous particle adhesion promoting layer of metal, glass, mineral or ceramic spherical particles having diameters of from 10 to 100 micrometers.

Chemical oxidation of polymer surfaces is also generally well known in the art as represented by U.S. Pat. Nos. 3,418,066 and 3,837,798.

The formation of metal-oxygen-polymer complexes at the surface of metal vapor coated, oxygen plasma treated polymeric materials has been noted as improving adhesion between the metal and the polymer (*J. Vac. Sci. Technol.*, J. M. Burkstrand, 16(4) July/August 1979). The effects of improved adhesion by plasma treatment of polymer surfaces is well known in the art (*J. Pol. Sci.*, 'ESCA Study of Polymer Surfaces Treated by Plasma,' H. Yasuda et al., (1977) Vol. 15, pp. 991–1019 and *J. Appl. Phys.*, "Metal-polymer Interfaces," J. M. Burkstrand, (1981) 52(7), pp. 4795–4800).

Ion sputtering to texture polymeric and metal surfaces is another available technique used to improve the adhesion to surfaces (NASA Technical Memoranda 79000 and 79004, Sovey and Mirtich, Technical paper present to 25th National Vacuum Symposium Nov. 28–Dec. 1, 1978).

Metal layers have also been sputtered onto electrophotographic films in a thickness of 0.7 to 4.0 mm in order to reduce visible light transmission as shown in U.K. Patent No. 1,417,628.

SUMMARY OF THE INVENTION

The present invention discloses an improved method of, and means for, priming polymeric surfaces and particularly for forming novel electrostatic charge transfer surfaces. Photoconductive insulators and dielectrics are provided with a multitude of conductivity sites to generate unique electrostatic charge donors and electrostatic charge receptors, respectively, which are then utilized to provide an efficient, high resolution means of transferring and developing electrostatic charge patterns. The invention also discloses a novel method for forming a primed polymer surface produced by an oxygen plasma treatment (R.F., A.C. or D.C. generated) with a metal containing species present in the plasma wherein a mediated oxidation of the polymer interface occurs to provide an oxygen-enriched primed polymer surface.

DETAILED DESCRIPTION AND SPECIFICATION OF THE INVENTION

According to the invention, the surfaces of a photoconductive insulator and a dielectric or a polymer such as polyester are treated to provide a multitude of conductivity sites or priming sites. Conductivity sites were produced by the R.F., A.C. or D.C. sputter deposition of an inorganic material such as a metal, metalloid, metalloid oxide, or metal oxide in an inert (e.g., Ar) or reactive (e.g., $O_2$ or $CO_2$) gas environment or by thermal including electron beam evaporation of a metal or metal oxide at pressures less than that typically used in sputter deposition. Priming sites were identically produced using a reactive gas environment. It should be understood that other metalloid-containing or metal-containing materials such as semiconductors could be used for the deposition material as primers or conductivity sites. The sputter deposition technique was particularly suited to maintaining a uniform size and distribution of conductivity sites over the entire surface. Particularly useful articles provided by this process include an improved electrostatic charge receptor and an improved electrostatic photoconductive-insulative charge donor. The resultant important performance improvement of these articles according to this invention resides in the increased electrostatic charge transfer efficiency between the two surfaces when they are brought into contact between the two surfaces on which conductivity sites exist. An additional, and just as important, improvement is that the efficient charge transfer is accomplished without an electrical bias; that is, the conductivity planes of the charge receptor and charge donor, respectively, need only be brought to the same electrical potential, which preferably is ground potential.

The general objective of the process is to produce a surface having discrete conductivity sites thereon. These conductivity sites should have a defined average size range (measured along the plane of the surface) of between about 2.5 and 9.0 nanometers. The distribution can be quite large, however. For example, when the average size is about 7.0 nm, the range in particle sizes can be from 5 to 12.0 nm, or even have a greater size distribution. The average particle size does appear to be critical to the practice of the invention even though the distribution may be broad. The distribution tends to be a result of the various processes of manufacture, however, and a broad distribution range is neither essential nor necessarily desirable. The broad average size range appears to be from 1.0 to 20.0 nm. The preferred range is from 2.5 to 9.0 nm. The more preferred range is from 3.0 to 8.0 nm, and the most preferred average sizes are between 3.5 and 7.5 nm.

In addition to the criticality of the average particle size of the conductivity sites, the spacing of the sites should be within reasonable limits. The sites should cover between 0.1 to 40% of the surface area, preferably 0.15 to 30% and more preferably between 0.20 and 20% of the surface area. If more area is covered, the surface essentially becomes a conductor. If less area is covered, the effects of the sites tend to not be noticeable.

Essentially any solid, environmentally stable inorganic material may be used as the composition of the conductivity sites. By environmentally stable it is meant that the material, in particulate form of from 2.5 to 9.0 nm, in air at room temperature and 30% relative humidity will not evaporate or react with the ambient environment to form a non-environmentally stable material within one minute. Metal particles can be deposited and, if these react to form environmentally stable metal oxide particles, are acceptable. Copper and nickel perform this way, for example. Metals which react to form unstable products within that time period, e.g., metal oxides which sublime or are liquld, would not be suitable. Surprisingly it has been found that the effect appears to be solely a function of conductivity site density and is independent of the bulk resistivity properties of the composition. It is preferred to have a bulk resistivity of less than $1 \times 10^{18}$ ohm-cm and more preferred if the bulk resistivity of the material is less than or equal to $1 \times 10^{12}$ ohm-cm. For example, silica ($SiO_2$), alumina, chromia, and all other inorganic compounds tested have been found to be quite effective in increasing the charge acceptance characteristics of the surface even though they are insulators. Essentially all environmentally stable materials having the described average particle size and distribution work in the present invention. Specific materials used include nickel, zinc, copper, silver, cobalt, indium, chromium/nickel alloy, stainless steel, aluminum, tin, chromium, manganese, window glass, and silica. Oxides of these materials and mixtures of metals and metal oxides of these materials also work quite well. It is apparent that sulfides, carbonates, halides and other compounds of metals and the like should also work in the present invention.

The conductivity sites may be deposited on the surface by a number of different processes, including but not limited to radio frequency (R.F.) sputtering, vapor deposition, chemical vapor deposition, thermal evaporation, A.C. sputtering, D.C. sputtering, electroless deposition, drying of sols, and drying in dilute solutions of the metal or compounds. The objective of all these processes is the distribution of controlled size particles. This is achievable in these processes by control of the speed, concentration of ingredients, and energy levels used. In almost all cases atomic or molecular size material is contacted with the surface and these materials tend to collect at nucleation sites or minute flaws in the surface. As the particles grow by attraction and accumulation of additional material, the process is carefully controlled to insure that the proper size and distribution of particles is effected. These procedures would be readily understood by one of ordinary skill in the art.

The effectiveness of the process for making charge receptive surfaces can be determined in a simple test. A control electrophotographic sheet comprising the sheet of Example 1 is charged to 450 volts. The charge surface of this sheet is contacted by the treated surface of the present invention. If at least 25% of the charge on the sheet is transferred within five seconds of contact, the material selected is clearly satisfactory.

A preferred utility of the present invention to providing a primed surface exhibiting enhanced adhesion is accomplished when a metal or metal oxide is selected as the material for producing the conductivity sites, a polymer such as polyester is selected as the dielectric substrate and R.F. sputter deposition is carried out in a reactive oxygen atmosphere. The polymer surface is considered primed if it passes the adhesive tape peel test, ANSI/ASTM D 903-49 (Reapproved 1978). This test consists of placing a piece of Scotch ® Brand Magic Mending Tape onto the treated surface and pressing it down to obtain firm adherence. Subsequently, the tape is peeled at a 180 degree angle at moderate speeds (approximately 50 cm/min). A surface that is primed shows a uniform splitting of the adhesive from the tape backing.

Preferred structures for charge transfer media according to the present invention comprise receptors and photoconductive elements or films. Receptors will generally comprise in sequence a support layer (such as paper or preferably an organic polymeric film), a conductive layer (such as metal, conductive resin, resin filled with conductive material, etc.), a dielectric layer and the conductivity sites according to the present invention. Photoconductive elements generally comprise a support layer, conductive layer, photoconductive layer (or layers) and the conductivity sites of the present invention. The term photoconductive layer is defined as including both single layers of materials (e.g., a single photoconductive material such as an organic or inorganic photoconductive material, or a charge generating material dispersed in a charge transport binding medium) and multiple layers (such as a layer of a charge generating material covered by a charge transport layer.

Objects and advantages of this invention are further illustrated by the following examples, but the particular materials and amounts thereof recited in these examples, as well as the conditions and details, should not be construed to unduly limit this invention.

EXAMPLE 1

A charge receptor was fabricated by selecting as a substrate a 15 cm long × 10 cm wide piece of 75μ thick polyester. Upon the substrate was vacuum vapor deposited (i.e., thermally evaporated) an aluminum metal layer which had a white light transparency of about 60 percent and a resistance of about 90 ohms/square. Subsequently, a dielectric layer was hand coated on the aluminum metal layer from a 15 wt. % Vitel ® PE 200 (polyester from Goodyear Tire and Rubber Co., Ohio, Chemical Division)/85 wt. % dichloroethane solution using a #20 Meyer bar which resulted in dried thickness of about 5μ. Further processing was done in a Veeco ® Model 776 radio frequency diode sputtering apparatus operating at a frequency of 13.56 MHz, modified to include a variable impedance matching network. The apparatus included two substantially parallel shielded circular aluminum electrodes, one of which (cathode) was 40 cm in diameter and the other (anode) was 20 cm in diameter with a 6.25 cm gap between them. The electrodes were housed in a glass jar provided with R.F. shielding. The bell jar was evacuatable and the cathode (driven electrode) and anode (floating electrode) were cooled by circulating water.

The foregoing composite was centrally placed on the aluminum anode with the dielectric layer facing the cathode. The source of the material to be sputter deposited was a copper plate, which plate was attached to the cathode thus facing the composite structure on the anode.

The system was then evacuated to about $1 \times 10^{-5}$ torr, and oxygen gas introduced through a needle valve. An equilibrium pressure in the range of $5 \times 10^{-4}$ torr to $8 \times 10^{-4}$ torr was maintained as oxygen was continuously introduced and pumped through the system.

With a shutter shielding the anode and composite structure thereon, R.F. energy was capacitively coupled to the cathode, initiating a plasma and was increased until a cathode power density of 0.38 watts/cm² was reached, thus causing copper to be sputtered from the cathode and deposited on the shutter. This cathode cleaning operation was carried on for about ten minutes to assure a consistent sputtering surface. The cathode power was then reduced to 0.15 watts/cm² and the sputtering rate was allowed to become constant as determined by a quartz crystal monitor. A typical sputtering rate was nominally 0.1 nm/60 seconds. The shutter was then opened and the reactive sputter deposition of copper metal onto the dielectric layer was continued for about 60 seconds. Reflected power is less than 2 percent. The coupling capacitance maintained the above stated power density. In 60 seconds, the average film thickness was, therefore, approximately 0.1 nm. A charge receptor surface consisting of copper or copper oxide conductivity sites having a median size of about 7.0 nm and an average spacing of about 20 nm was thus formed.

A charge donor material was treated in a similar manner. However, the composite structure consisted of a 75μ thick polyester layer covered by a conductive indium iodide layer, which in turn was covered by an 8.5μ thick organic photoconductive-insulative layer and is commercially available from Eastman Kodak Company as EK SO-102, in the R.F. sputtering apparatus discussed above with the exception that the material deposited was 304 stainless steel. The average thickness of the stainless steel deposited was nominally 0.05 nm and formed a distribution of conductivity sites on the surface of the photoconductive-insulative layer.

The photoconductive-insulator layer used above (EK SO-102) comprises a mixture of (1) a polyester binder derived from terephthalic acid, ethylene glycol and 2,2-bis(4-hydroxyethoxyphenyl)propane, (2) a charge transport material comprising bis(4-diethylamino-2-methylphenyl)-phenylmethane, and (3) a spectral sensitizing dye absorbing at green and red wavelengths in combination with a supersensitizer.

The charge donor was then charged to +900 volts using a corona source and image-wise exposed to generate a high resolution electrostatic charge pattern. With the electrostatic charge pattern on its surface, the charge donor was then brought into intimate contact with a charge receptor using a grounded electrically conductive rubber roller. The roller provides electrical contact to the back electrode for the charge receptor as well as providing the moderate pressure needed for good contact. Measurement of the surface potential on the charge receptor after separation from charge donor indicated that about 50% of the electrostatic charge transferred. The transferred electrostatic charge pattern was then stored as long as several days and subsequently developed, or developed immediately with toner to reveal a visible image of the charge pattern.

A suitable toner for development of the transferred electrostatic charge was composed as shown in Table I.

TABLE I

| Raw Material | Proportions by weight | % Composition by weight |
|---|---|---|
| Tintacarb 300[a] | 2 | 10.5 |
| Polyethylene AC-6[b] | 1 | 5.3 |
| OLOA 1200[c] | 4 | 21.0 |
| Isopar M[d] | 12 | 63.2 |
| | | 100.0 |

[a]Tintacarb 300 Carbon Black manufactured by Australian Carbon Black, Altona, Victoria, Australia
[b]Polyethylene AC-6, low molecular weight polyethylene manufactured by Allied Chemicals, New York
[c]OLOA 1200, an oil soluble succinimide manufactured by the Chevron Chemical Company, San Francisco, California
[d]Isopar M, Isoparaffinic hydrocarbon, high boiling point, manufactured by Exxon Corp.

The tonor components were mixed according to the following sequence:
1. The carbon black was weighed and added to a ball jar.
2. The Polyethylene AC-6, OLOA 1200 and Isopar M were weighed into a common container, preferably a glass beaker, and the mixture heated on a hotplate with stirring until solution occurred. A temperature of 110° C. ±10° C. was sufficient to melt the polyethylene and a clear brown solution was obtained.
3. The solution from (2) was allowed to cool slowly to ambient temperature, preferably around 20° C., in an undisturbed area. The wax precipitated upon cooling, and the cool opaque brown slurry so formed was added to the ball jar.
4. The ball jar was sealed, and rotated at 70-75 rpm for 120 hours. This milling time was for a jar of 2600 mL nominal capacity, with an internal diameter of 18 cm. A jar of these dimensions would take a total charge of 475 g of raw materials, in the proportions stated in Table I.
5. Upon completion of the milling time, the jar was emptied and the contents placed in a suitable capacity container to form the final toner concentrate designated MNB-2.

The resultant image was of excellent quality wherein the optical density was about 1.4, the resolution was about 216 lp/mm and the slope ($\gamma$) in the linear portion of optical density as a function of log exposure was about 1.1.

COMPARATIVE EXAMPLE 1

A charge receptor and a charge donor were prepared as in Example 1, however, no conductivity sites were deposited on either of the articles. When the image-wise exposure, electrostatic charge image transfer and transferred charge development were carried out as in Example 1, only about 9% of the electrostatic charge transferred and the resolution of the developed image was only about 100 lp/mm.

COMPARATIVE EXAMPLE 2

A charge receptor and a charge donor were prepared as in Example 1, however, no conductivity sites were deposited on the charge receptor. When the image-wise exposure, electrostatic charge image transfer and transferred charge development were carried out as in Example 1, only about 28% of the electrostatic charge transferred and the resolution of the developed image was only about 150 lp/mm.

COMPARATIVE EXAMPLE 3

A charge receptor and a charge donor were prepared as in Example 1, however, no conductivity sites were deposited on the charge donor. When the image-wise exposure, electrostatic charge image transfer and transferred charge development were carried out as in Example 1, only about 39% of the electrostatic charge transferred and the resolution of the developed image was only about 170 lp/mm.

EXAMPLES 2-14

Electrostatic charge image patterns were generated, transferred and developed as in Example 1 with the exception that chromium (Cr), silver (Ag), tin (Sn), cobalt (Co), manganese (Mn), nickel (Ni), iron (Fe), molybdenum (Mo), stainless steel, zinc (Zn), aluminum (Al), window glass and quartz were used respectively to generate the conductivity sites on the charge receptor. Results obtained thus far indicate charge transfer efficiencies in excess of 30% and developed resolutions greater than 170 lp/mm for all these examples. Results with the sputtering performed in argon and carbon dioxide atmospheres were equally successful.

The utility of the present invention in providing a primed surface exhibiting enhanced adhesion is demonstrated in the following additional examples.

EXAMPLE 15

A 12.5 cm×25.0 cm piece of 75$\mu$ thick polyester was selected as the substrate. The R.F. sputtering apparatus of Example 1 was utilized with the exception that the anode was 40 cm in diameter. The substrate was placed on the anode, the chamber evacuated and an equilibrium pressure in the range of $5 \times 10^{-4}$ torr to $10 \times 10^{-4}$ torr of oxygen was maintained. Copper was sputtered at a cathode power in the range of 0.38 watts/cm² to 0.46 cm². The deposition was stopped when about 0.5 nm of copper had been deposited.

The primed surface so prepared was subjected to the adhesion peel test described above and a uniform splitting of the adhesive from the tape backing occurred.

EXAMPLE 16

A 12.5 cm×25.0 cm piece of 75µ Tedlar ® (polyvinylfluoride) was selected as the substrate and treated as in Example 15. It, too, passed the adhesion tape peel test.

EXAMPLE 17

A 12.5 cm×25.0 cm piece of 75µ polyethylene was selected as the substrate and treated as in Example 15. The surface so primed passed the adhesion tape peel test. Substantially identical results were obtained using polypropylene as the substrate.

EXAMPLE 18

Continuous R.F. reactive sputter treatment was also utilized to prime polymer surfaces. A 15 cm wide roll of polybutyleneterephthalate (PBT) was loaded on a web handling apparatus and inserted into the vacuum chamber of a planar magnetron sputtering system. The vacuum chamber was evacuated to approximately $5 \times 10^{-6}$ torr and oxygen admitted to obtain a flow rate of 54 standard cc/min with a chamber pressure in the range of $10 \times 10^{-3}$ torr to $25 \times 10^{-3}$ torr. The web was passed by a copper planar magnetron sputter deposition cathode at a rate of 0.1 to 2 cm/sec. The cathode to web spacing was 6 cm. The gas plasma was formed by driving the cathode by a radio frequency (13.56 MHz) generator at a power in the range of 1.1 watts/cm² to 3.4 watts/cm².

The surface so primed passed the adhesion tape peel test.

EXAMPLE 19

A 15 cm wide roll of single layer 60/40 copolymer of polyethyleneterephthalate and polyethylene-isophthalate was treated as in Example 18. The surface so primed passed the adhesion tape peel test.

EXAMPLES 20-21

The materials of Examples 18 and 19 were primed as in Example 18 with the exception that the planar magnetron sputter deposition cathode was chromium. These primed surfaces passed the adhesion tape peel test and were particularly stable in humid environments.

EXAMPLES 22-23

The materials of Examples 18 and 19 were primed as in Example 18 with the exception that the planar magnetron sputter deposition cathode was aluminum and the gas plasma was formed by driving the cathode by a direct current (D.C.) generator at a power in the range of 1.1 watts/cm² to 1.3 watts/cm².

The surfaces so primed passed the adhesion tape peel test.

An ESCA (electron spectroscopy for chemical analysis) study of surfaces of polymers that were treated under plasma conditions, as disclosed in the examples, was conducted. A determination of properties and conditions that resulted in priming versus conditions and properties which did not result in priming was sought. In the case of priming with chromium, which is preferred in this disclosure, the Cr $2p^{3/2}$ binding energy for primed surfaces was 576.6 ev, whereas the Cr $2p^{3/2}$ binding energy for unprimed surfaces was 577.1 ev. In the case of priming with aluminum, the Al 2s binding energy for primed surfaces was 119.0 ev, whereas the Al 2s binding energy for unprimed surfaces was 119.3 ev. All binding energies are referenced to C 1s which is at 284.6 ev. These determined binding energies have been found to be a function of preparation conditions and not of average deposited metal thickness as reported by Burkstrand, supra.

The materials primed as disclosed above were found particularly useful in forming composite structures with pressure sensitive acrylic, 1234), and hot melt segmented copolyester adhesives.

EXAMPLE 24

A 4 inch×6 inch (approximately 10 cm×15 cm) sample of polyester with a vapor deposited film of aluminum (60% transmissive) as a conductive layer thereon was coated with 5 micrometers of polyester (Vitel ® PE 200). This film composite was placed in a vacuum chamber equipped with a thermal evaporation assembly and a shutter. The composite was placed approximately 20 cm above the source of material to be deposited. The system was evaporated to $1-2 \times 10^{-5}$ torr and, with the shutter closed, power was applied to the copper filled tungsten support boat. When the deposition rate was constant, as evidenced by readings from a thickness monitor, the shutter was opened and 0.1 nanometers of copper was deposited. The 0.1 nanometer coated sample was tested according to the same procedures used in Example 1 and was found to provide transferred resolution after development of greater than 100 lp/mm.

EXAMPLE 25

A charge receptor was prepared as in Example 1 with the exception that gold (Au) was used as the metal in forming the conductive sites. The charge donor was a plain cadmium sulfide crystalline photoreceptor commercially available from Coulter Systems Company as KC101. After image-wise exposure, electrostatic charge transfer and transferred charge development were carried out according to the method of Example 1, the developed image had a resolution of 130 lp/mm. About 4.0% of the charge had been transferred.

The imaging and developing process was repeated on an identical receptor without conductivity sites and no image could be produced, and no charge transfer could be detected.

EXAMPLE 26

The previous example was repeated except that the photoreceptor comprised a 1.59 mm thick aluminum blanket covered by a 40 micrometer amorphous composition comprising 94% by weight selenium and 6% by weight tellurium. Resolution of the developed image was 120 lp/mm. About 40% of the charge had been transferred during the process.

Metalloids are equally useful in the practice of the present invention in place of or in combination with the metals and metal compounds described above. Metal alloys, metal-metaloid alloys, and metalloid alloys are also useful and can be applied as discrete sites according to the procedures described above. Metalloids are elements well understood in the art and include, for example, silicon, boron, arsenic, germanium, gallium, tellurium, selenium and the like. The metalloids, in the same fashion as the metals, may be present in the form of metalloid compounds. The terms "metal compounds" and "metalloid compounds" are defined according to the present invention to mean oxides, chalconides (e.g., sulfides), halides, borides, arsenides, antimonides, carbides, nitrides, silicides, carbonates, sulfates, phosphates, cluster compounds of metals and metalloids, and combinations thereof.

Terms such as 'oxides' are not limited to exact stoichiometric equivalence. Materials with either an excess or deficiency of stoichiometric oxygen are useful and can be produced according to the techniques described above. Sputtering of silica in an inert atmosphere tends to produce a sub-oxide, for example.

Various modifications and alterations of this invention will become apparent to those skilled in the art without departing from the scope and spirit of this invention, and it should be understood that this invention is not to be unduly limited to the illustrative embodiments set forth herein.

We claim:

1. An article comprising a substrate having on at least one surface thereof uncoated discrete sites of an inorganic material different from the composition of said at least one surface which prime the surface according to ANSI/ASTM D 903-49 and/or increase the electrostatic charge transfer efficiency of the surface, said discrete sites having a bulk resistivity of less than $1 \times 10^{18}$ ohm-cm, an average length of between 1.0 and 20 nm and covering between 0.1 and 40% of said surface.

2. The article of claim 1 wherein said material is an environmentally stable material selected from the group consisting of metals, metalloids, metal compounds, metalloid compounds and combinations thereof.

3. The article of claim 2 wherein the discrete sites have an average length of between 2.5 and 9.0 nm and covering between 0.15 and 30% of said surface.

4. The article of claims 2 or 3 wherein said sites comprise metal.

5. The article of claims 2 or 3 wherein said sites comprise metal oxides.

6. The article of claims 2 or 3 wherein said sites comprise a mixture of metal and metal oxides.

7. The article of claim 3 wherein said sites have an average length measured along the plane of the surface of between 3.0 and 8.0 nm and said sites comprise metal, metal oxide or mixtures of metal and metal oxide.

8. The article of claims 1, 2 or 3 wherein said surface is an organic polymeric material.

9. The article of claims 1, 2 or 3 wherein the surface of said substrate comprises an organic photoconductive-insulator layer.

10. The article of claims 1, 2 or 7 comprising a photoconductive element having as the substrate, in sequence, a support layer, a conductive layer, and a photoconductive layer, with the discrete sites on said photoconductive layer.

11. An article comprising a substrate having on at least one surface of a substrate thereof uncoated discrete sites of an inorganic material different from the composition of said at least one surface which increase the electrostatic charge transfer efficiency of the surface, said discrete sites having a bulk resistivity of less than $1 \times 10^{18}$ ohm-cm, an average length of between 1.0 and 20 nm and covering between 0.1 and 40% of said surface, said substrate comprising a photoconductive element.

12. The article of claim 11 wherein the surface of said substrate comprises an organic photoconductive-insulator layer and said conductive sites comprise metal.

13. The article of claim 11 wherein the surface of said substrate comprises an organic photoconductive-insulator layer and said conductive sites comprise metal oxides.

14. The article of claim 11 wherein the surface of said substrate comprises an organic photoconductive-insulator layer and said conductive sites comprise a mixture of metal and metal oxide.

15. The article of claim 11 comprising a photoconductive element having as the substrate, in sequence, a support layer, a conductive layer, and a photoconductive layer, with the discrete sites on said photoconductive layer and wherein said conductive sites comprise metal.

16. The article of claim 11 comprising a photoconductive element having as the substrate, in sequence, a support layer, a conductive layer, and a photoconductive layer, with the discrete sites on said photoconductive layer and wherein said conductive sites comprise a mixture of metal and metal oxide.

17. The article of claim 11 wherein said sites are on a charge donating photoconductive-insulating surface.

18. The article of claim 11 in which a surface of a photoconductive insulator of said photoconductive element has the sites thereon.

19. The article of claim 11 in which the photoconductive layer of said photoconductive element comprises multiple layers.

20. The article of claim 11 in which the photoconductive layer of said photoconductive element comprises a single layer.

* * * * *